United States Patent
Tilton

(10) Patent No.: US 7,428,152 B1
(45) Date of Patent: Sep. 23, 2008

(54) LOCALIZED THERMAL MANAGEMENT SYSTEM

(75) Inventor: Donald E. Tilton, Liberty Lake, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 88 days.

(21) Appl. No.: 11/553,867

(22) Filed: Oct. 27, 2006

(51) Int. Cl.
*H05K 7/20* (2006.01)
*H01L 23/36* (2006.01)

(52) U.S. Cl. .................. 361/699; 361/698; 361/700; 361/719; 361/720; 165/80.4; 165/104.33

(58) Field of Classification Search ............... 361/699, 361/700, 704, 707, 712, 715–719, 720, 722, 361/816, 748, 758, 760, 762; 165/80.2, 80.3, 165/80.4, 104.33, 104.34, 185; 62/64, 259.2; 174/15.1, 15.2, 16.3, 252; 257/698, 706, 257/712, 713, 714, 719, 720, 721, 722, 787; 29/830, 832, 846
See application file for complete search history.

(56) References Cited

U.S. PATENT DOCUMENTS

| | | | |
|---|---|---|---|
| 4,967,201 A * | 10/1990 | Rich, III | 342/175 |
| 5,000,256 A | 3/1991 | Tousignant | |
| 5,220,804 A * | 6/1993 | Tilton et al. | 62/64 |
| 5,665,185 A * | 9/1997 | Meeker | 156/62.2 |
| 5,792,677 A * | 8/1998 | Reddy et al. | 438/122 |
| 6,008,987 A * | 12/1999 | Gale et al. | 361/700 |
| 6,201,701 B1 * | 3/2001 | Linden et al. | 361/720 |
| 6,212,071 B1 * | 4/2001 | Roessler et al. | 361/704 |
| 6,243,269 B1 * | 6/2001 | Dibene et al. | 361/720 |
| 6,257,329 B1 * | 7/2001 | Balzano | 165/185 |
| 6,605,778 B2 * | 8/2003 | Dorfler et al. | 174/524 |
| 6,770,967 B2 * | 8/2004 | Barcley | 257/706 |
| 7,054,159 B2 * | 5/2006 | Nakamura | 361/719 |
| 7,295,441 B1 * | 11/2007 | Laio et al. | 361/719 |

OTHER PUBLICATIONS http://www.cmap.ca/open/events/2004jun_Thermal/Board%20Level%20Thermal%20Mgmt_PCooke.pdf.

* cited by examiner

*Primary Examiner*—Michael V Datskovskiy
(74) *Attorney, Agent, or Firm*—Michael S. Neustel

(57) ABSTRACT

A localized thermal management system for efficiently thermally managing a plurality of heat producing devices. The localized thermal management system includes a thermal management unit and a plurality of thermal vias in thermal communication with the thermal management unit. The thermal vias are further in thermal communication with a plurality of heat producing devices for conducting heat from the heat producing devices and transferring the heat to the thermal management unit.

21 Claims, 6 Drawing Sheets

LOCALIZED THERMAL MANAGEMENT SYSTEM

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to thermal management systems for electronic devices and more specifically it relates to a localized thermal management system for efficiently thermally managing a plurality of heat producing devices.

2. Description of the Related Art

Any discussion of the prior art throughout the specification should in no way be considered as an admission that such prior art is widely known or forms part of common general knowledge in the field.

Modern electronic devices (e.g. microprocessors, circuit boards and power supplies) and other heat producing devices have significant thermal management requirements. Conventional dry thermal management technology (e.g. forced air convection using fans and heat sinks) simply is not capable of efficiently thermally managing modern electronics. Metallic thermal vias are utilized to conduct heat from electronic devices on circuit boards and to disperse the heat along the length of thermal vias. Typically, thermal vias are installed to prevent an electronic component from overheating during a reflow solder process. During such a process the electronic component is not actively operating and is not the source of heat.

Single-phase liquid thermal management systems (e.g. liquid cold plates) and two-phase liquid thermal management systems (e.g. spray cooling, pool boiling, flow boiling, jet impingement cooling, falling-film cooling, parallel forced convection, curved channel cooling and capillary pumped loops) have been in use for years for thermally managing various types of heat producing devices. Spray cooling technology is being adopted today as the most efficient option for thermally managing electronic systems. U.S. Pat. No. 5,220,804 entitled High Heat Flux Evaporative Spray Cooling to Tilton et al. describes the earlier versions of spray technology. U.S. Pat. No. 6,108,201 entitled Fluid Control Apparatus and Method for Spray Cooling to Tilton et al. also describes the usage of spray technology to cool a printed circuit board.

BRIEF SUMMARY OF THE INVENTION

In view of the foregoing disadvantages inherent in the known types of thermal management systems now present in the prior art, the present invention provides a new localized thermal management system construction wherein the same can be utilized for efficiently thermally managing a plurality of heat producing devices.

The general purpose of the present invention, which will be described subsequently in greater detail, is to provide a new localized thermal management system that has many of the advantages of the thermal management systems mentioned heretofore and many novel features that result in a new localized thermal management system which is not anticipated, rendered obvious, suggested, or even implied by any of the prior art thermal management systems, either alone or in any combination thereof.

To attain this, the present invention generally comprises a thermal management unit and a plurality of thermal vias in thermal communication with the thermal management unit. The thermal vias are further in thermal communication with a plurality of heat producing devices for conducting heat from the heat producing devices and transferring the heat to the thermal management unit.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a localized thermal management system that will overcome the shortcomings of the prior art devices.

A second object is to provide a localized thermal management system for efficiently thermally managing a plurality of heat producing devices.

Another object is to provide a localized thermal management system that provides a cost effective thermal management system.

An additional object is to provide a localized thermal management system that may be utilized within various applications where heat is produced from various locations such as on a circuit board.

A further object is to provide a localized thermal management system that utilizes a plurality of thermal vias in combination with a centralized spray unit to efficiently thermally manage a plurality of heat producing devices.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1A:
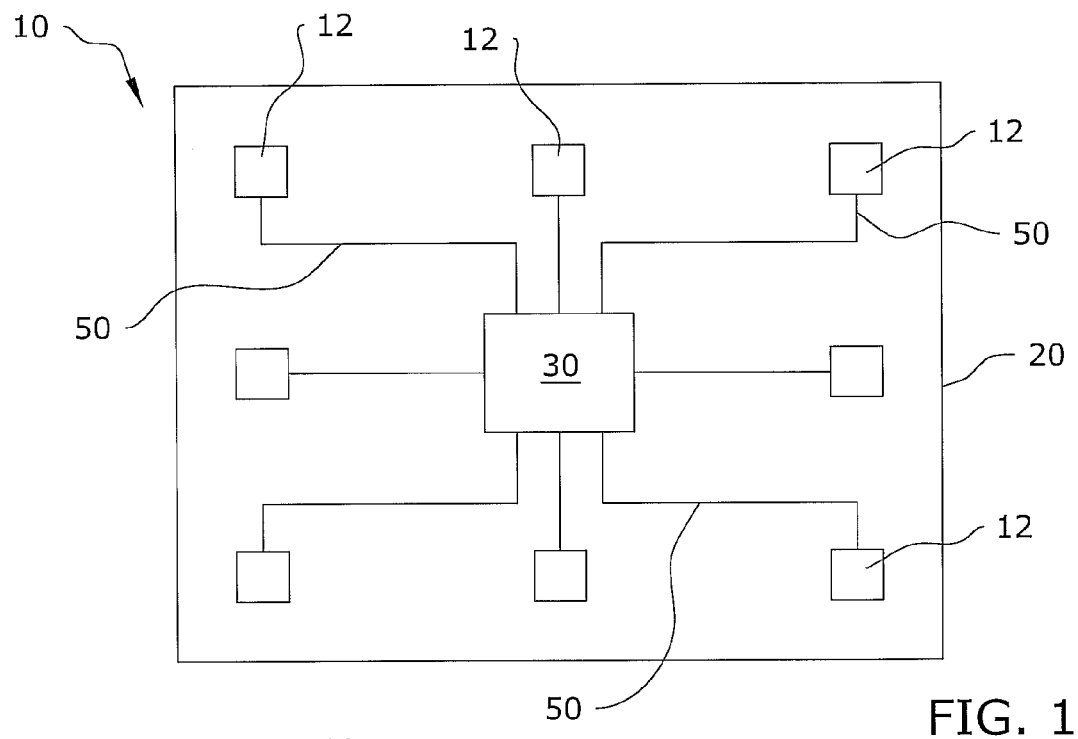
FIG. 1a is a top view of the present invention implemented upon a circuit board.
Figure 1B:
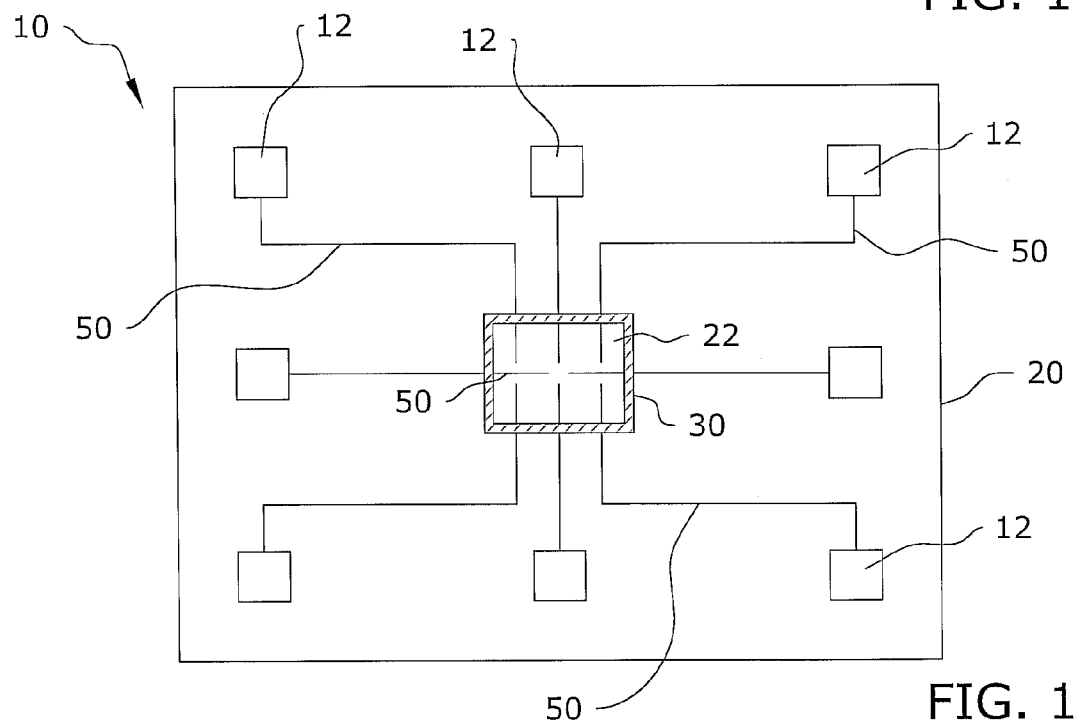
FIG. 1b is a top cutaway view of the present invention implemented upon a circuit board with the thermal management unit partially cutaway showing the cooling surface and an exemplary arrangement of the thermal vias.

Turning now descriptively to the drawings, in which similar reference characters denote similar elements throughout the several views, FIGS. 1a through 7b illustrate a localized thermal management system 10, which comprises a thermal management unit 30 and a plurality of thermal vias 50 in thermal communication with the thermal management unit 30. The thermal vias 50 are further in thermal communication with a plurality of heat producing devices 12 for conducting heat from the heat producing devices 12 and transferring the heat to the thermal management unit 30.

FIGS. 1a through 3 illustrate a circuit board 20 with a plurality of heat producing devices 12 attached to the circuit board 20. The present invention is preferably utilized with respect to a circuit board 20 with a plurality of heat producing devices 12 (e.g. microprocessors, circuit boards 20 and power supplies), however the present invention may be implemented in various other manners and applications.

B. Thermal Management Unit

Figure 2:
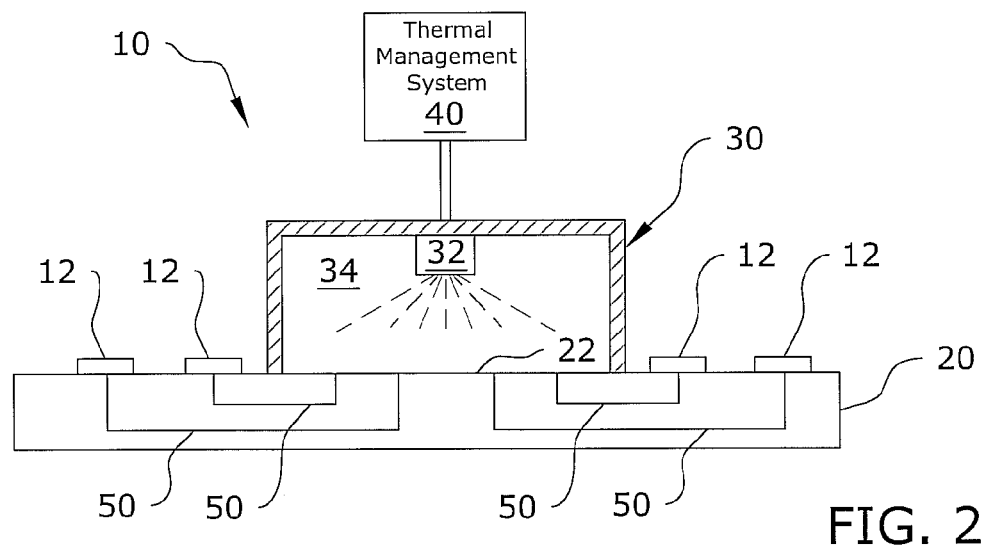
FIG. 2 is a side cutaway view of the present invention implemented upon a circuit board.
Figure 3:
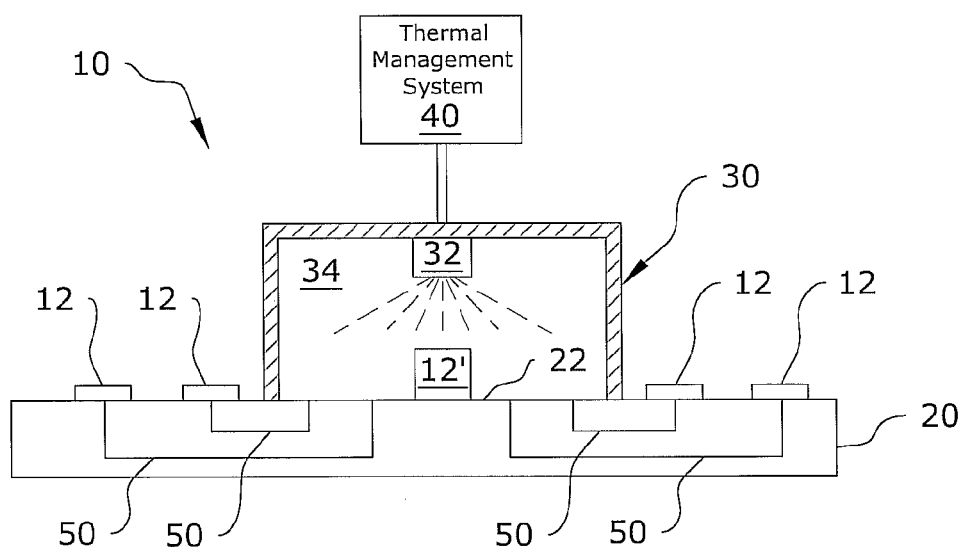
FIG. 3 is a side cutaway view of the present invention implemented upon a circuit board with a heat producing device positioned within the spray unit.
Figure 4:
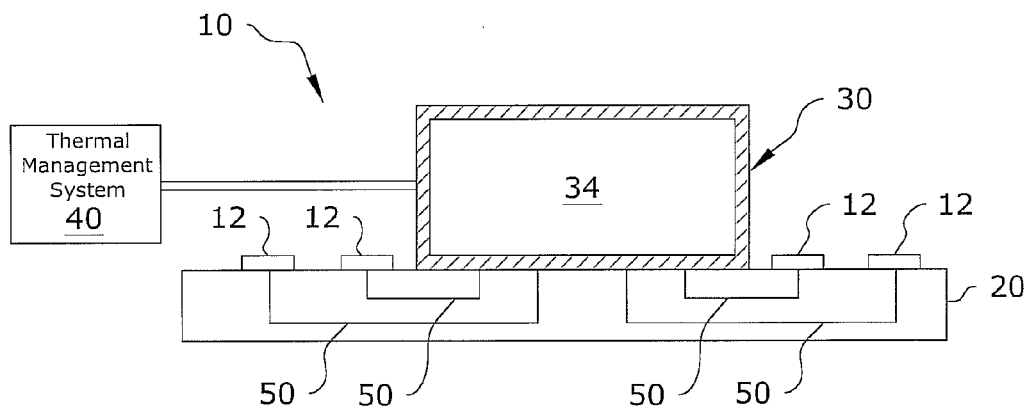
FIG. 4 is a side cutaway view of the present invention implemented upon a circuit board using a liquid cold plate technology with a wall in thermal communication with the cooling surface.
Figure 5:
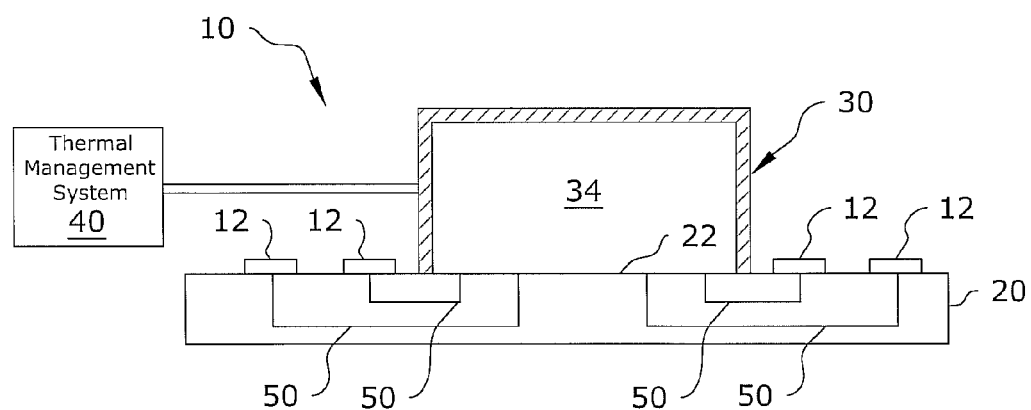
FIG. 5 is a side cutaway view of the present invention implemented upon a circuit board using a liquid cold plate technology where the coolant directly contacts the cooling surface.

The present invention includes at least one thermal management unit 30 that utilizes single-phase or multi-phase liquid thermal management technology (e.g. spray cooling, liquid cold plate). FIGS. 2 and 3 illustrate utilizing a spray cooling technology for the thermal management unit 30. FIGS. 4 and 5 illustrate using a liquid cold plate technology for the thermal management unit 30.

The thermal management unit 30 is preferably attached to the circuit board 20, however the thermal management unit 30 may be physically separate from the circuit board 20. The thermal management unit 30 is preferably centrally positioned upon the circuit board 20 or centrally positioned with respect to the heat producing devices 12, however the thermal management unit 30 may be positioned in various other locations. The thermal management unit 30 preferably includes a thermal management chamber 34 that thermally manages a cooling surface 22.

The thermal management unit 30 preferably is comprised of a multi-phase spray unit that includes a spray chamber and a spray nozzle 32 for applying atomized liquid coolant to the cooling surface 22. The spray unit may be comprised of various well-known spray cooling systems currently available for thermally managing heat producing devices (e.g. microprocessors, circuit boards and power supplies) with an atomized coolant.

As shown in FIGS. 2 and 3 of the drawings, a thermal management system 40 is fluidly connected to the thermal management unit 30. The thermal management system 40 provides thermally conditioned coolant to the thermal management unit 30 and receives waste coolant from the thermal management unit 30. The thermal management system 40 may be comprised of any conventional thermal management system capable of receiving and thermally treating heated waste coolant from the thermal management unit 30.

The thermal management unit 30 applies coolant upon the cooling surface 22 contained by the thermal management unit 30. If a liquid cold plate technology for the thermal management unit 30 is utilized, the coolant may not directly contact the cooling surface 22 because of an enclosed housing structure for the liquid cold plate. The cooling surface 22 is in thermal communication with the plurality of thermal vias 50. It is preferable that at least a portion of the cooling surface 22 is comprised of the thermal vias 50. The cooling surface may also be at least partially comprised of a surface of the circuit board 20.

FIG. 2 illustrates the heat producing devices 12 being all external of the thermal management unit 30. FIGS. 3 and 6c illustrate an alternative embodiment wherein at least one internally positioned heat producing device 12' is positioned within the thermal management chamber 34 of the thermal management unit 30 and at least one externally positioned heat producing device 12 is positioned externally of thermal management unit 30. As shown in FIGS. 3 and 6c of the drawings, the thermal management unit 30 directly thermally manages the internal heat producing device 12' and indirectly thermally manages the external heat producing devices 12 by utilizing the externally extending thermal vias 50. The internal heat producing device 12' preferably has a higher power density that the external heat producing devices 12.

C. Thermal Vias

As shown in FIGS. 1a through 3 of the drawings, a plurality of thermal vias 50 are utilized in the present invention to transfer heat from the heat producing devices 12 to the thermal management unit 30 for efficient removal of the heat. The thermal vias 50 may be comprised of any conventional thermal via technology. The plurality of thermal vias 50 conduct heat from the plurality of heat producing devices 12 and transfer the heat to the thermal management unit 30. The thermal vias 50 are preferably attached to the circuit board 20.

Each of the plurality of thermal vias 50 is in thermal communication with the thermal management unit 30 and at least one of the plurality of heat producing devices 12 as shown in the figures. FIGS. 1b through 5 illustrate the thermal vias 50 positioned within the cooling surface 22. The thermal vias 50 are preferably exposed within the thermal management chamber 34 to make up at least a portion of the cooling surface 22 being thermally managed by the thermal management unit 30.

Figure 7A:
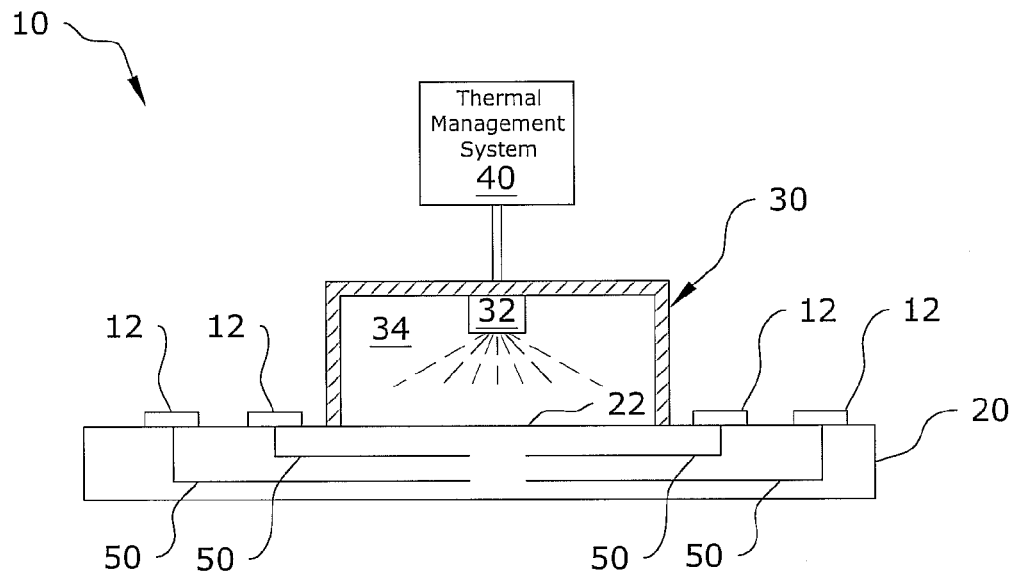
FIG. 7a is a side cutaway view of the present invention with the thermal vias extending beneath the cooling surface of the circuit board.
Figure 7B:
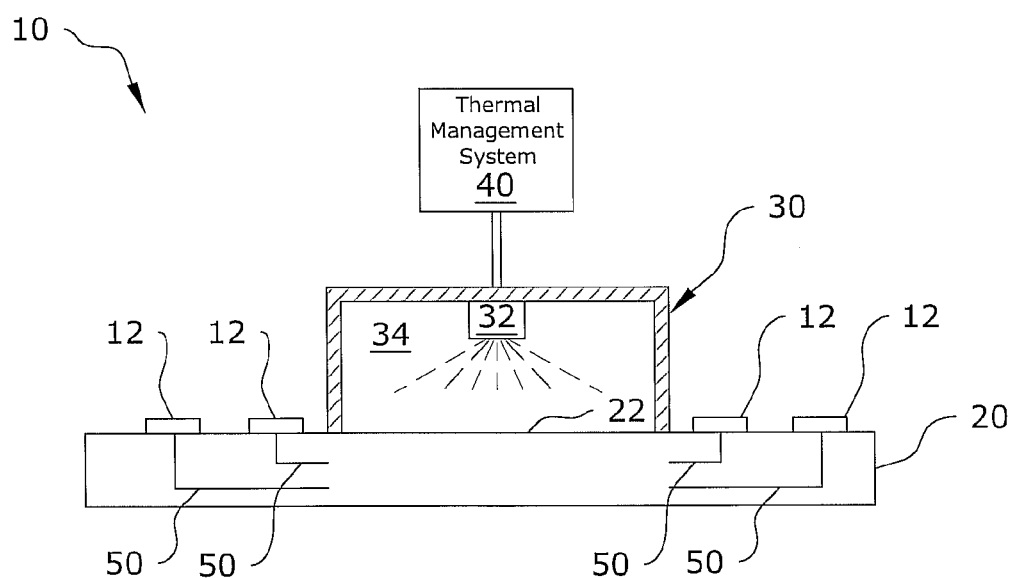
FIG. 7b is a side cutaway view of the present invention with the thermal vias positioned near the thermal management unit and the cooling surface.

Alternatively, the thermal vias 50 may not be exposed within the cooling surface 22 and may be in direct thermal communication with the cooling surface 22 instead as illustrated in FIGS. 7a and 7b. In the alternative embodiment shown in FIG. 7a, the thermal vias extend beneath the cooling surface 22 and therefore are beneath the thermal management unit 30. In the alternative embodiment shown in FIG. 7b, the thermal vias extend to near the cooling surface 22 and the thermal management unit 40 without being directly beneath the cooling surface 22 or the thermal management unit 40.

An individual thermal via 50 is preferably thermally connected to only one heat producing device 12, however it may be desirable to connect an individual thermal via 50 to more than one heat producing device 12. Multiple thermal vias 50 may also be thermally connected to a single heat producing device 12.

D. Alternative Embodiment

Figure 6A:
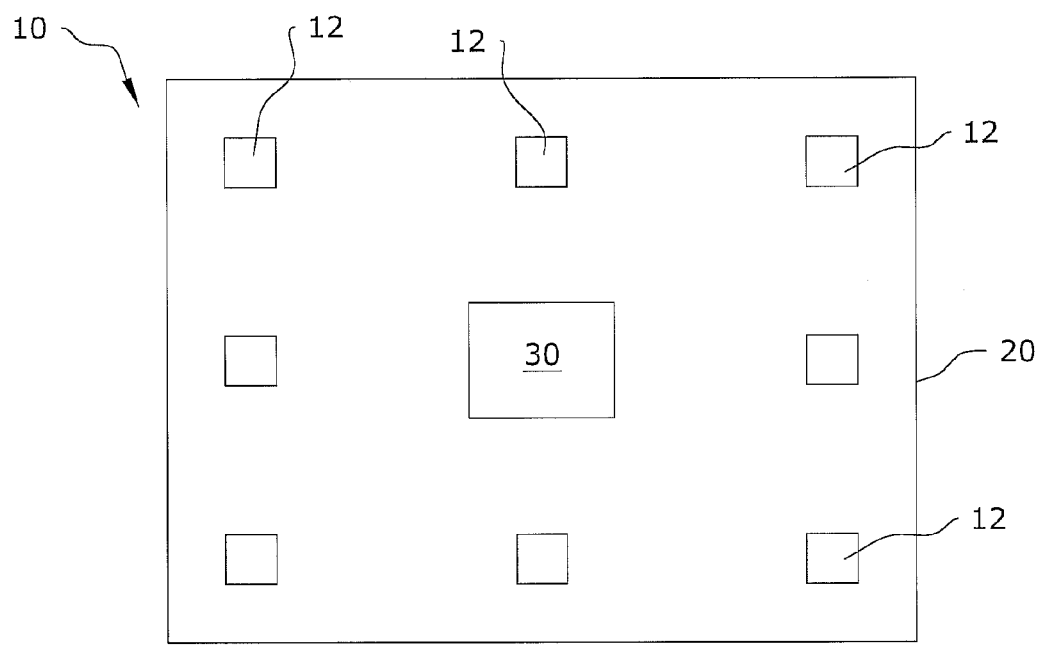
FIG. 6a is a top view of the present invention implemented upon a circuit board without thermal vias.
Figure 6B:
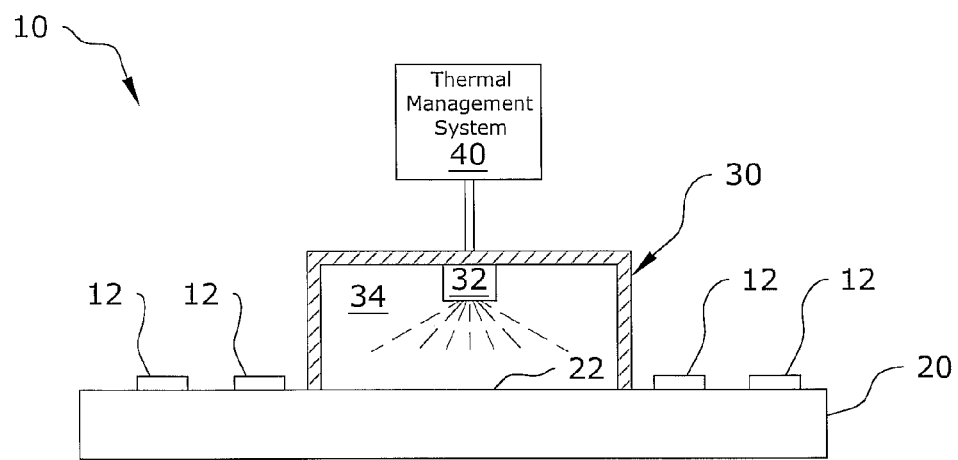
FIG. 6b is a side cutaway view of the present invention implemented upon a circuit board without the usage of thermal vias.
Figure 6C:
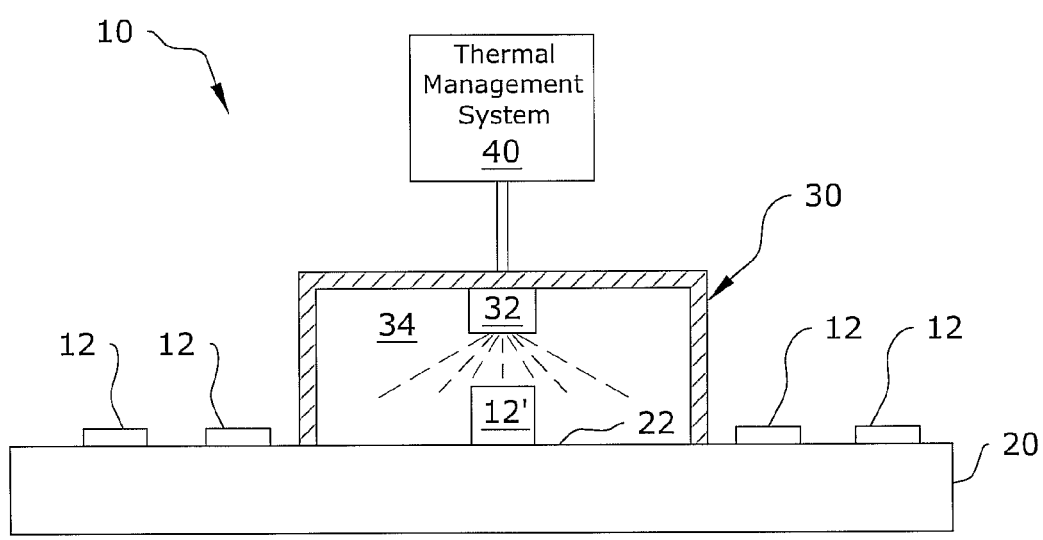
FIG. 6c is a side cutaway view of the present invention implemented upon a circuit board without the usage of thermal vias and with a heat producing device positioned within the thermal management chamber.

FIGS. 6a and 6b illustrate an alternative embodiment of the present invention. As shown in FIGS. 6a and 6b, the thermal management unit 30 is positioned upon the circuit board without thermal vias thermally connecting the thermal management unit 30 to the plurality of heat producing devices 12. The only thermal connection between the cooling surface 22 of the circuit board 20 and the plurality of heat producing devices 12 is the circuit board 20. The heat generated by the heat producing devices 12 is conducted by the circuit board 20 and is transferred to the cooling surface 22 of the circuit board 20 which is thermally managed by the thermal management unit 30. This is a suitable embodiment when the plurality of heat producing devices 12 are comprised of very low power electronic devices.

In this alternative embodiment, it is preferable to not include any heat producing devices within the thermal management chamber 34. In this alternative embodiment, it is also preferable to not physically connect the external heat producing devices 12 to the cooling surface 22 within the thermal management unit 30.

In another alternative embodiment shown in FIG. 6c, a heat producing device 12' is positioned within the thermal management chamber 34 of the thermal management unit 30. In this alternative embodiment, the cooling surface 22 is comprised of the circuit board surface between the heat producing device 12' and the thermal management unit 30. The cooling surface 22 is utilized to conduct a portion of the heat generated by the external low powered heat producing devices 12. In this alternative embodiment, the cooling surface 22 is preferably equal to or greater than the surface of the heat producing device 12' to ensure adequate thermal management of the cooling surface 22.

E. Operation of Invention

In use, the heat producing devices 12, 12' are activated and thereby produce heat. The heat produced by the external heat producing devices 12 is conducted by the thermal vias 50 and transferred to the cooling surface 22 where the thermal management unit 30 is applying coolant upon to thermally manage the cooling surface 22.

Liquid coolant is applied to the cooling surface 22 to thermally manage the cooling surface 22. In a multi-phase embodiment of the present invention, the coolant applied (e.g. sprayed) to the cooling surface 22 may be partially vaporized with the non-vaporized coolant conducting heat also to cool the cooling surface 22. If a heat producing device 12' is positioned within the thermal management chamber 34 of the thermal management unit 30, the thermal management unit 30 thermally manages the interior heat producing device 12' directly and thermally manages the other external heat producing devices 12 by thermally managing the thermal vias 50.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

I claim:

1. A localized thermal management system, comprising:
    a circuit board;
    a plurality of heat producing devices attached to said circuit board;
    a thermal management unit;
    a thermal management system fluidly connected to said thermal management unit, wherein said thermal management system provides thermally conditioned coolant to said thermal management unit and receives waste coolant from said thermal management unit; and
    a plurality of thermal vias, wherein each of said plurality of thermal vias is in thermal communication with said thermal management unit and at least one of said plurality of heat producing devices;
    wherein said plurality of thermal vias conduct heat from said plurality of heat producing devices and transfer said heat to said thermal management unit;
    wherein said thermal management unit applies liquid coolant upon a cooling surface;
    wherein said cooling surface is in thermal communication with said plurality of thermal vias;
    at least one of said plurality of heat producing devices positioned within a thermal management chamber of said thermal management unit and at least one of said plurality of heat producing devices positioned externally of said thermal management unit.

2. The localized thermal management system of claim 1, wherein said thermal management unit is attached to said circuit board.

3. The localized thermal management system of claim 1, wherein said cooling surface is comprised of a surface of said circuit board.

4. The localized thermal management system of claim 1, wherein said cooling surface includes a portion of said plurality of thermal vias.

5. The localized thermal management system of claim 1, wherein said plurality of heat producing devices are comprised of electronic devices.

6. The localized thermal management system of claim 1, wherein said thermal management unit is centrally positioned upon said circuit board.

7. The localized thermal management system of claim 1, wherein said thermal vias are attached to said circuit board.

8. The localized thermal management system of claim 1, wherein said thermal management unit is comprised of a spray unit having a spray chamber and a spray nozzle.

9. A localized thermal management system, comprising:
    a plurality of heat producing devices;

a spray unit including a spray chamber and a spray nozzle; and a plurality of thermal vias, wherein each of said plurality of thermal vias is in thermal communication with said spray unit and at least one of said plurality of heat producing devices;

wherein said plurality of thermal vias conduct heat from said plurality of heat producing devices and transfer said heat to said spray unit;

wherein said spray unit sprays coolant upon a cooling surface contained by said spray unit;

wherein said cooling surface is in thermal communication with said plurality of thermal vias;

at least one of said plurality of heat producing devices positioned within said spray chamber of said spray unit and at least one of said plurality of heat producing devices positioned externally of spray unit.

10. The localized thermal management system of claim 9, wherein said cooling surface includes a portion of said plurality of thermal vias.

11. The localized thermal management system of claim 9, wherein said plurality of heat producing devices are comprised of electronic devices.

12. A localized thermal management system, comprising:
a circuit board;
a plurality of heat producing devices attached to said circuit board;
a spray unit including a spray chamber and a spray nozzle;
wherein said spray unit is attached to said circuit board;
a thermal management system fluidly connected to said spray unit, wherein said thermal management system provides thermally conditioned coolant to said spray unit and receives waste coolant from said spray unit; and
a plurality of thermal vias, wherein each of said plurality of thermal vias is in thermal communication with said spray unit and at least one of said plurality of heat producing devices;
wherein said plurality of thermal vias conduct heat from said plurality of heat producing devices and transfer said heat to said spray unit;
wherein said spray unit sprays coolant upon a cooling surface contained by said spray unit;
wherein said cooling surface is comprised of a surface of said circuit board and a portion of said plurality of thermal vias;
wherein said cooling surface is in thermal communication with said plurality of thermal vias;
wherein said thermal vias are attached to said circuit board;
at least one of said plurality of heat producing devices positioned within said spray chamber of said spray unit and at least one of said plurality of heat producing devices positioned externally of spray unit.

13. The localized thermal management system of claim 12, wherein said plurality of heat producing devices are comprised of electronic devices.

14. The localized thermal management system of claim 12, wherein said spray unit is centrally positioned upon said circuit board.

15. A localized thermal management system, comprising:
a circuit board;
a plurality of heat producing devices attached to said circuit board;
a thermal management unit, wherein said thermal management unit is centrally positioned upon said circuit board;
a thermal management system fluidly connected to said thermal management unit, wherein said thermal management system provides thermally conditioned coolant to said thermal management unit and receives waste coolant from said thermal management unit; and
a plurality of thermal vias, wherein each of said plurality of thermal vias is in thermal communication with said thermal management unit and at least one of said plurality of heat producing devices;
wherein said plurality of thermal vias conduct heat from said plurality of heat producing devices and transfer said heat to said thermal management unit;
wherein said thermal management unit applies liquid coolant upon a cooling surface;
wherein said cooling surface is in thermal communication with said plurality of thermal vias.

16. The localized thermal management system of claim 15, wherein said cooling surface is comprised of a surface of said circuit board.

17. The localized thermal management system of claim 15, wherein said cooling surface includes a portion of said plurality of thermal vias.

18. The localized thermal management system of claim 15, wherein said plurality of heat producing devices are comprised of electronic devices.

19. The localized thermal management system of claim 15, wherein said thermal vias are attached to said circuit board.

20. The localized thermal management system of claim 15, wherein at least one of said plurality of heat producing devices positioned within a thermal management chamber of said thermal management unit and at least one of said plurality of heat producing devices positioned externally of said thermal management unit.

21. The localized thermal management system of claim 15, wherein said thermal management unit is comprised of a spray unit having a spray chamber and a spray nozzle.

* * * * *